United States Patent
Huang et al.

(10) Patent No.: US 6,566,282 B2
(45) Date of Patent: May 20, 2003

(54) METHOD OF FORMING A SILICON OXIDE LAYER

(75) Inventors: Cheng-Chieh Huang, Hsin-Chu Hsien (TW); Tse-Wei Liu, Hsin-Chu (TW); Tang Yu, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/885,048

(22) Filed: Jun. 21, 2001

(65) Prior Publication Data

US 2002/0197888 A1 Dec. 26, 2002

(51) Int. Cl.[7] ............................................. H01L 21/469
(52) U.S. Cl. ..................... 438/787; 438/33; 438/235; 438/424; 438/439; 438/579; 438/624
(58) Field of Search .................................. 438/787, 624, 438/424, 439, 235, 33, 579

(56) References Cited

U.S. PATENT DOCUMENTS

| | | | | |
|---|---|---|---|---|
| 5,258,333 A | * | 11/1993 | Shappir et al. | 437/235 |
| 5,484,738 A | * | 1/1996 | Chu et al. | 437/33 |
| 5,571,578 A | * | 11/1996 | Kaji et al. | 427/579 |
| 5,780,103 A | * | 7/1998 | Toebben et al. | 427/226 |
| 6,245,691 B1 | * | 6/2001 | Jang et al. | 438/787 |

FOREIGN PATENT DOCUMENTS

JP  0-738-003 A2 * 10/1996

* cited by examiner

Primary Examiner—Michael S. Lebentritt
Assistant Examiner—Pho Luu
(74) Attorney, Agent, or Firm—Winston Hsu

(57) ABSTRACT

A silicon oxide layer is formed on a semiconductor wafer by performing a high temperature oxidation (HTO) process using dichlorosilane ($SiH_2Cl_2$) and nitrous oxide ($N_2O$), as reacting gases, having a flow rates with a ratio greater than 2:1, respectively. The reacting moles of dichlorosilane to nitrous oxide are in the proportion of 1:2.

6 Claims, 1 Drawing Sheet

METHOD OF FORMING A SILICON OXIDE LAYER

BACKGROUND OF THE INVENTION

1. Field of the Invention

The present invention relates to a method of forming a silicon oxide layer on a semiconductor wafer to reduce production of hydrochloric acid (HCl) thus preventing corrosion of the machine used for high temperature oxidation (HTO).

2. Description of the Prior Art

In the semiconductor industry, silicon oxide, with proper dielectric constant and excellent cohesion to silicon surface, is commonly used as a gate oxide, local oxidation of silicon (LOCOS), field oxide, interlayer dielectric, pad oxide, etc. As the number of devices fabricated on the wafer increases, the required quality of the silicon oxide becomes more stringent.

There are three commonly adopted methods of forming a silicon oxide film on the surface of a semiconductor wafer: (1) chemical vapor deposition (CVD), (2) high temperature oxidation (HTO), and (3) spin-on glass (SOG). Generally the silicon oxide film formed by HTO process has the best electrical and physical characteristics. The HTO process according to the prior art includes furnace oxidation and rapid thermal oxidation (RTO) for different furnaces and heating models. In a furnace oxidation process according to the prior art, the silicon oxide layer is formed on the semiconductor wafer by performing a HTO process under the conditions of constant temperature, pressure and volume. Dichlorosilane (DCS, $SiH_2Cl_2$) and nitrous oxide ($N_2O$), having a flow rate ratio less than 1:2 respectively, are used as reacting gases. The formula for the main reaction is as follows:

$$SiH_2Cl_2 + 2N_2O \rightarrow SiO_2 + 2N_2 + 2HCl \qquad (1)$$

In daily operations, flow rates of $SiH_2Cl_2$ and $N_2O$ are often set as 165 standard cubic centimeters per minute (sccm) and 300 sccm respectively, while the inside pressure of the furnace is balanced at 0.45 torr by nitrogen ($N_2$).

Also, a minor reaction simultaneously occurs as $SiH_2Cl_2$ is heated. The formula for this minor reaction is as follows:

$$SiH_2Cl_2 \rightarrow SiHCl + HCl \qquad (2)$$

According to the Ideal Gas Law, the number of moles of the gas is proportional to its volume under the condition of constant temperature and pressure. So the hydrochloric acid, product in both of the main and the minor reactions, is produced at a rate of 315 sccm.

The HCl produced in both the main and minor reaction is highly corrosive to the HTO machine. Besides, as specifications for the semiconductor devices become more and more complicated, the requirement for both the uniformity and deposition rate of the silicon oxide layer tend to be more and more rigid as well. Thus it is important to improve the method of forming silicon oxide layer so as to reduce production of HCl as well as to increase both the deposition rate and uniformity of the silicon oxide layer.

SUMMARY OF THE INVENTION

It is therefore a primary object of the present invention to provide a method of forming a silicon oxide layer on a semiconductor wafer so as to prevent corrosion of the high temperature oxidation (HTO) machine due to the hydrochloric acid (HCl) produced.

In the preferred embodiment of the present invention, a silicon oxide layer is formed on a semiconductor wafer by performing a HTO process using dichlorosilane (DCS, $SiH_2Cl_2$) and nitrous oxide ($N_2O$) as reacting gases, having a flow rate ratio greater than 2:1 respectively. The reacting moles of $SiH_2Cl_2$ to $N_2O$ are in the proportion of 1:2 respectively.

It is an advantage of the present invention against the prior art that a DCS-rich surface is firstly formed on the surface of the semiconductor wafer via physical method. So the silicon oxide produced in the subsequent reaction, using $SiH_2Cl_2$ and $N_2O$ as reacting gases, on the DCS-rich surface can easily adhere to the surface of the semiconductor wafer. The production of HCl is thus reduced and the deposition rate and uniformity of the silicon oxide increases. Therefore, the quality of the semiconductor products can be significantly improved and the corrosion of the HTO machine can be prevented.

These and other objectives of the present invention will no doubt become obvious to those of ordinary skill in the art after reading the following detailed description of the preferred embodiment, which is illustrated in the multiple figures and drawings.

DETAILED DESCRIPTION OF THE PREFERRED EMBODIMENT

Figure 1:
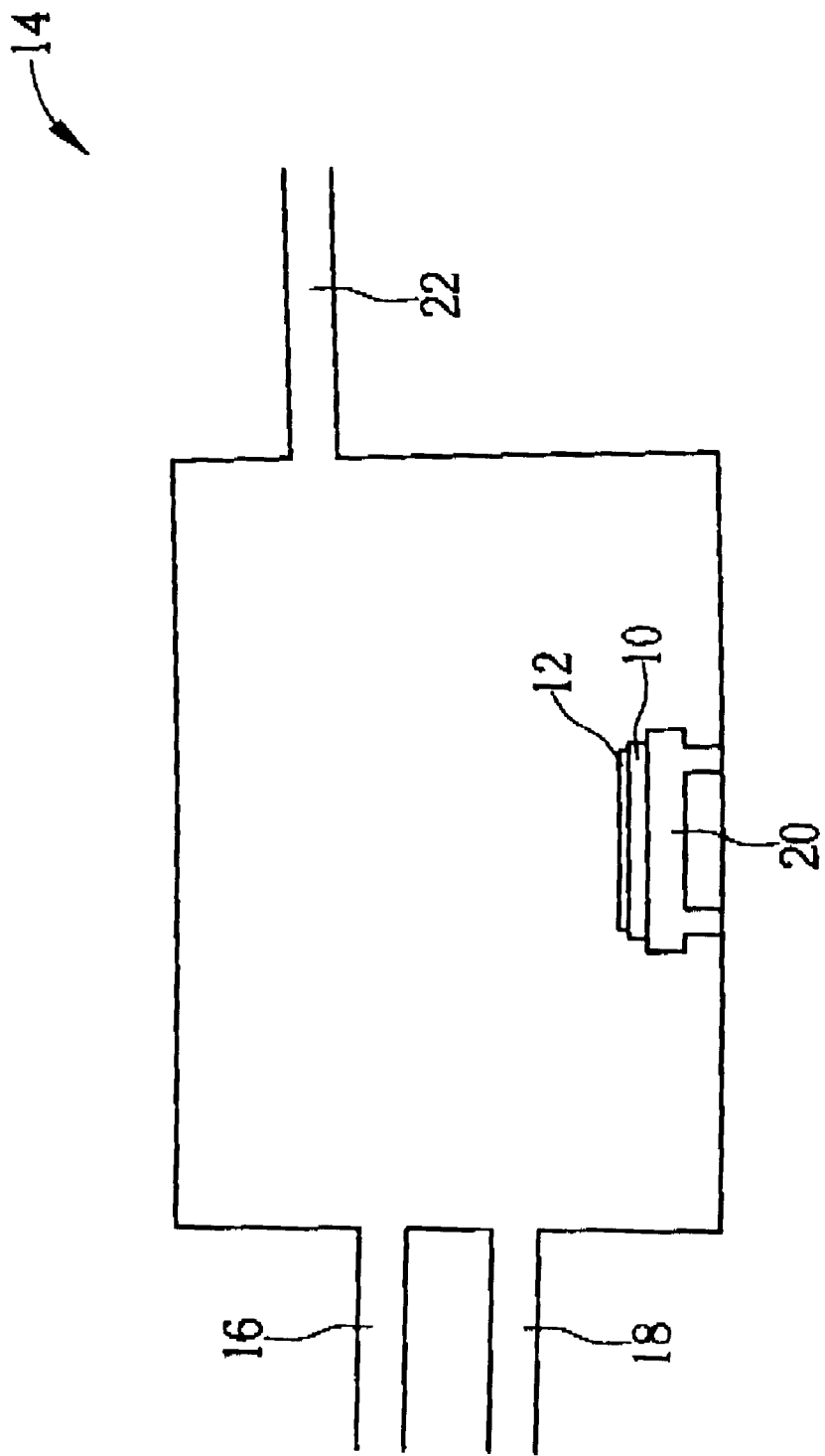
FIG. 1 is a schematic view of forming a silicon oxide layer on a semiconductor wafer according to the present invention.

Please refer to FIG. 1 of a schematic view of forming a silicon oxide layer 12 on a semiconductor wafer 10 in a HTO machine 14 according to the present invention. As shown in FIG. 1, the reaction for forming the silicon oxide layer 12 on the semiconductor wafer 10 is performed in a HTO machine 14 comprising a DCS gas inlet 16, a $N_2O$ gas inlet 18, a wafer stage 20 for holding the semiconductor wafer 10, and a gas abstracting device 22. Different from the furnace oxidation process according to the prior art, the method provided in the present invention is to form a silicon oxide layer 12 on the semiconductor wafer 10 by performing a HTO process, under the condition of constant temperature, pressure and volume, using Dichlorosilane (DCS, $SiH_2Cl_2$) and nitrous oxide ($N_2O$), as reacting gases introduced in to the HTO machine 14 respectively via the DCS gas inlet 16 and the $N_2O$ gas inlet 18, having the flow rate ratio greater than 2:1 respectively. The formulas for both the main and minor reactions are as follows:

$$SiH_2Cl_2 + 2N_2O \rightarrow SiO_2 + 2N_2 + 2HCl \qquad (1)$$

$$SiH_2Cl_2 \rightarrow SiHCl + HCl \qquad (2)$$

In daily operations, the flow rates of $SiH_2Cl_2$ and $N_2O$ are often set as 80 standard cubic centimeters per minute (sccm) and 20 sccm respectively, and the inside pressure of the HTO machine 14 is balanced at 0.36 torr by nitrogen ($N_2$). According to the Ideal Gas Law, the number of moles of the gas is proportional to its volume under the condition of constant temperature and pressure. So the production rate of HCl in both the main and the minor reactions is 90 sccm, much lower than that of 315 sccm in the prior art. Consequently corrosion of the HTO machine 14 caused by HCl is prevented.

The concentration of DCS in the present invention is higher than that in the prior art so that a DCS-rich surface can be firstly formed on the surface of the semiconductor wafer 14 via physical method. The silicon oxide produced in the subsequent reaction, using $SiH_2Cl_2$ and $N_2O$ as reacting gases, on the DCS-rich surface can easily adhere to the surface of the semiconductor wafer 14. The simultaneously produced byproduct HCl and $N_2$ can be away from the surface of the semiconductor wafer 14 via the mechanism of diffusion.

In contrast to the present invention, the concentration of $N_2O$ in the prior art is higher than that in the present invention so that a $N_2O$-rich surface is firstly formed on the surface of the semiconductor wafer 10 via physical method. Due to the imperfect collision angle between $SiH_2Cl_2$ and $N_2O$ molecules, the silicon oxide produced in the main reaction on the $N_2O$-rich surface can not easily adhere to the surface of the semiconductor wafer 10 and would be removed by the abstracting device 24 of the HTO machine 14. So even though the flow rates of both $SiH_2Cl_2$ and $N_2O$ in the present invention are less than that in the prior art, the deposition rate and uniformity of the silicon oxide 12 layer in the present invention are much better than that in the prior art.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of forming a silicon oxide layer on a semiconductor wafer to reduce production of hydrochloric acid (HCl) so as to prevent corrosion of a high temperature oxidation (HTO) machines the method comprising:
   using dichlorosilane ($SiH_2Cl_2$) and nitrous oxide ($N_2O$) as reacting gases to perform the HTO process to form the silicon oxide layer on the semiconductor wafer;
   wherein the proportion of the flow rate of dichlorosilane to nitrous oxide is greater than 2 to 1.

2. The method of claim 1 wherein the proportion of the moles of dichlorosilane to nitrous oxide is about 1 to 2.

3. The method of claim 1 wherein the silicon oxide layer is formed of silicon dioxide.

4. A method of increasing both the deposition rate and uniformity of a silicon oxide layer on a semiconductor wafer, the method comprising:
   using dichlorosilane ($SiH_2cl_2$) and nitrous oxide ($N_2O$) as reacting gases to perform a HTO process to form the silicon oxide layer on the semiconductor wafer;
   wherein the proportion of the moles of dichlorosilane to nitrous oxide is about 1 to 2, and the proportion of the flow rate of dichlorosilane to nitrous oxide is greater than 2 to 1.

5. The method of claim 4 wherein the silicon oxide layer is formed of silicon dioxide.

6. The method of claim 4 wherein the method is used to reduce production of hydrochloric acid (HCl) so as to prevent corrosion of the HTO machine.

* * * * *